(12) United States Patent
Braun et al.

(10) Patent No.: US 7,689,961 B2
(45) Date of Patent: Mar. 30, 2010

(54) INCREASED POWER LINE NOISE IMMUNITY IN IC USING CAPACITOR STRUCTURE IN FILL AREA

(75) Inventors: Florian Braun, Stuttgart (DE); Hanyi Ding, Essex Junction, VT (US); Kai D. Feng, Essex Junction, VT (US); Zhong-Xiang He, Essex Junction, VT (US); Howard S. Landis, Underhill, VT (US); Xuefeng Liu, South Burlington, VT (US); Geoffrey Woodhouse, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 302 days.

(21) Appl. No.: 11/161,634

(22) Filed: Aug. 10, 2005

(65) Prior Publication Data

US 2007/0038968 A1 Feb. 15, 2007

(51) Int. Cl.
*G06F 17/50* (2006.01)
(52) U.S. Cl. .................... 716/10; 716/2; 716/4
(58) Field of Classification Search ............... 716/8–10, 716/18, 2, 4
See application file for complete search history.

(56) References Cited

U.S. PATENT DOCUMENTS

| | | | |
|---|---|---|---|
| 6,085,032 A * | 7/2000 | Scepanovic et al. | 716/10 |
| 6,232,154 B1 | 5/2001 | Reith et al. | |
| 6,323,050 B1 * | 11/2001 | Dansky et al. | 438/17 |
| 6,353,248 B1 | 3/2002 | Reith et al. | |
| 6,763,509 B2 | 7/2004 | Korobkov | |
| 6,782,512 B2 * | 8/2004 | Asakawa | 716/1 |
| 7,062,732 B2 * | 6/2006 | Ito et al. | 716/5 |
| 7,086,026 B2 * | 8/2006 | Berry et al. | 716/10 |
| 7,171,645 B2 * | 1/2007 | Ito et al. | 716/19 |
| 2003/0148578 A1 | 8/2003 | Ku et al. | |
| 2003/0200509 A1 * | 10/2003 | Takabayashi et al. | 716/1 |
| 2004/0073881 A1 | 4/2004 | Nassif et al. | |

(Continued)

OTHER PUBLICATIONS

Fentanes, J. et al., "Place Decoupling Capacitances in a Floor Plan," IBM Technical Disclosure Bulletin, vol. 38, No. 8, Aug. 1995, p. 269.

(Continued)

*Primary Examiner*—Stacy A Whitmore
(74) *Attorney, Agent, or Firm*—Anthony J Canale; Hoffman Warnick LLC

(57) ABSTRACT

Increase power line noise immunity in an IC is provided by using decoupling capacitor structure in an area of the IC that is typically not used for routing, but filled with unconnected and non-functional metal squares (fills). In one embodiment, a method includes providing a circuit design layout; determining a density of a structure in an area of the circuit design layout; and in response to the density being less than a pre-determined density for the structure in the area, filling in a portion of the area with at least one capacitor structure until a combined density of the structure and the at least one capacitor structure in the area is about equal to the pre-determined density. Power line noise immunity is increased by increasing decoupling capacitance without enlarging the IC's total size by using a (fill) area that would normally be filled with unconnected and non-functional metal shapes.

17 Claims, 9 Drawing Sheets

U.S. PATENT DOCUMENTS

2005/0050508 A1* 3/2005 Gore et al. .................. 716/12

OTHER PUBLICATIONS

Author Unknown, "On-Chip Decoupling Capacitors for VLSI Gate Array and Master Image Products," IBM Technical Disclosure Bulletin, Jan. 1989, pp. 381-382.

Author Unknown, "On-Chip Decoupling Capacitor for Logic VLSI Chips," IBM Technical Disclosure Bulletin, Aug. 1987, p. 1280.

Author Unknown, "Integrated Decoupling Capacitor," IBM Technical Disclosure Bulletin, May 1978, pp. 5201-5202.

Dinger, T. R. et al., "Controlled Impedance Very Large Scale Integration Interconnects with On-Chip Decoupling Capacitors," IBM Technical Disclosure Bulletin, vol. 38, No. 1, Jan. 1995, pp. 373-376.

* cited by examiner

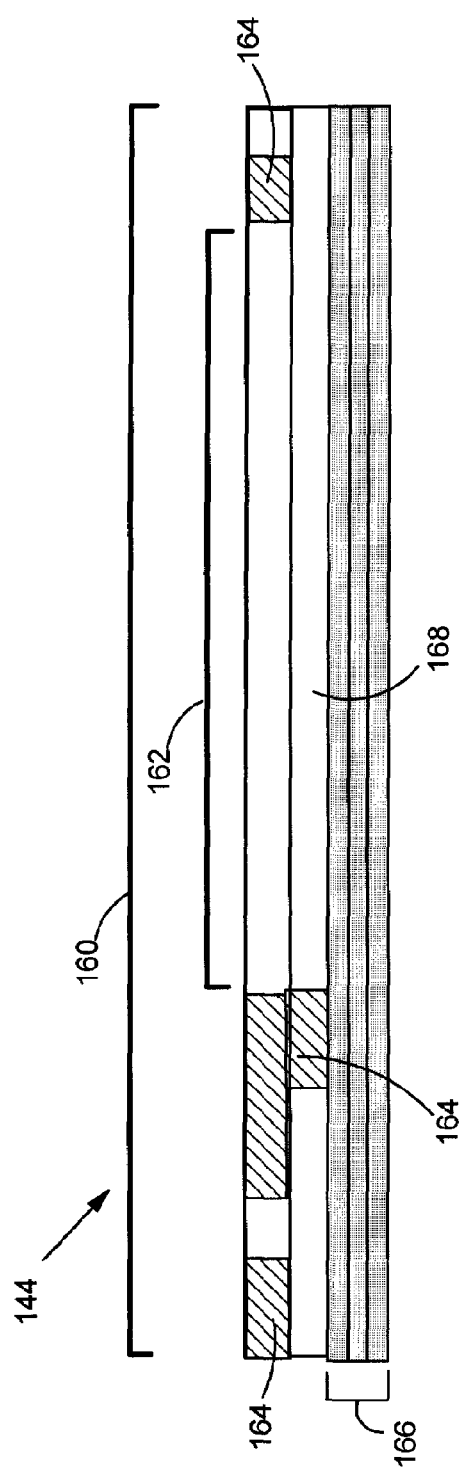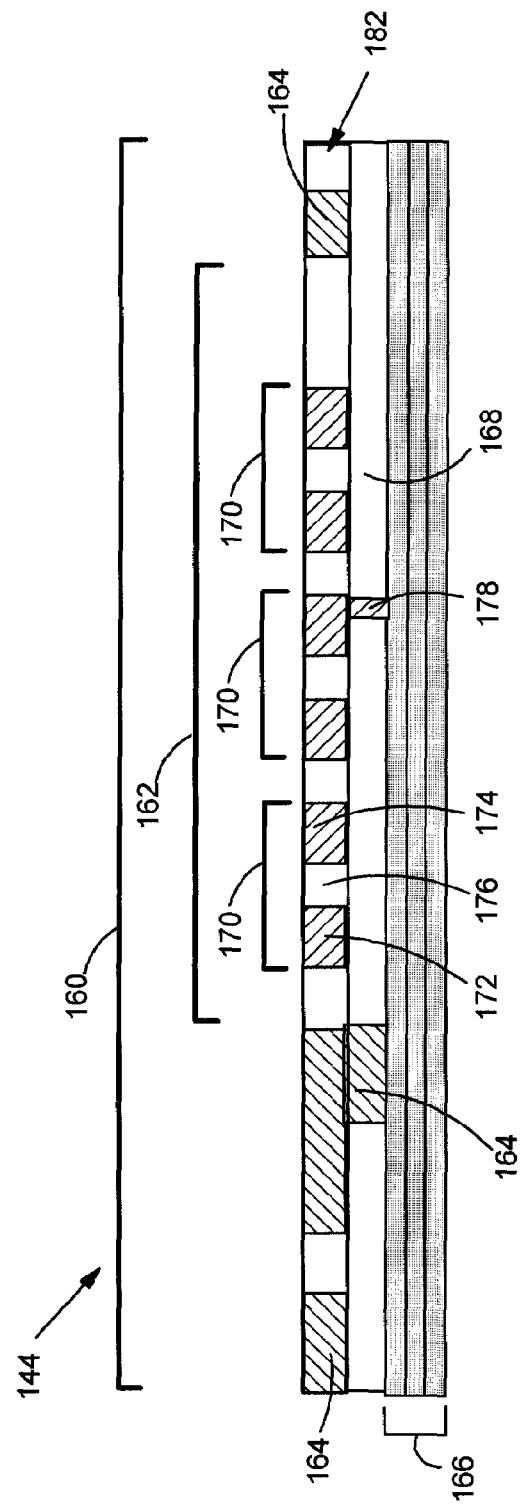

INCREASED POWER LINE NOISE IMMUNITY IN IC USING CAPACITOR STRUCTURE IN FILL AREA

BACKGROUND OF THE INVENTION

1. Technical Field

The invention relates generally to semiconductor fabrication, and more particularly, to a way to provide increase power line noise immunity in an integrated circuit (IC) by maximizing decoupling capacitance using a fill area.

2. Background Art

The density check is a necessary procedure after a very large scale integrated circuit (VLSI) design including layout is completed. The conventional density check process is to check local density of each material layer and determine whether the density is within the pre-determined upper and lower values. When the density is lower than the low limit, a set of small square isolated elements of the layer material are filled in the area to reach the density. These shapes are not connected to anything in the IC, so they serve no functional purpose relative to IC functioning. On the other hand, integrated circuits (ICs) require decoupling capacitors to filter out the noise generated by switching circuits. In particular, whenever a transistor switches, it generates the noise on the power line. For example, in some phase-lock-loop (PLL) systems, the digital switching noise reaches about 400 mV peak-to-peak while the power supply voltage is 1 V only. Ideally, the amount of decoupling capacitance is maximized as much as possible because the more decoupling capacitance provided, the more the noise is filtered and the noise immunity of the IC improved. However, due to the limited area available and cost of an IC, the decoupling capacitance is not able to be very large. The shapes of the decoupling capacitors are rectangular. Currently, decoupling capacitors are front-end-of-line (FEOL) only devices and are normally placed in designated chip area during an early stage of chip design. One problem with this approach, however, is that IC development continues to pursue further miniaturization and higher performance, i.e., faster clock speeds. Higher performance increases the need for decoupling capacitance, hence, increasing the need for larger chip area, which results in the increase in chip cost.

On the other hand, certain portions of an IC chip typically include circuit layout with little or no metal in a specific metal wiring layer. Since these areas have a low density for the metal layer, small bits of unconnected metal (fill) are added to increase the density of that metal in that specific area in an effort to meet manufacturing fabrication requirements for chemical-mechanical polish. These shapes are not connected to anything in the IC, so they serve no functional purpose relative to IC functioning.

In view of the foregoing, there is a need in the art for a solution that provides maximized decoupling capacitance on the ICs.

SUMMARY OF THE INVENTION

Increase power line noise immunity in an IC is provided by using decoupling capacitor structure in an area of the IC that is typically not used for routing, but filled with unconnected and non-functional metal squares (fills). In one embodiment, a method includes providing a circuit design layout; determining a density of a structure in an area of the circuit design layout; and in response to the density being less than a pre-determined density for the structure in the area, filling in a portion of the area with at least one capacitor structure until a combined density of the structure and the at least one capacitor structure in the area is about equal to the pre-determined density. Power line noise immunity is increased by increasing decoupling capacitance without enlarging the IC's total size by using a (fill) area that would normally be filled with unconnected and non-functional metal shapes.

A first aspect of the invention provides a method of increasing power line noise immunity in an integrated circuit, the method comprising the steps of: providing a circuit design layout; determining a density of a structure in an area of the circuit design layout; and in response to the density being less than a pre-determined density for the structure in the area, filling in a portion of the area with at least one capacitor structure until a combined density of the structure and the at least one capacitor structure in the area is about equal to the pre-determined density.

A second aspect of the invention provides a system for increasing power line noise immunity in an integrated circuit, the system comprising: means for providing a circuit design layout; means for determining a density of a structure in an area of the circuit design layout; and means for filling in a portion of the area with at least one capacitor structure, in response to the density being less than a pre-determined density for the structure in the area, until a combined density of the structure and the at least one capacitor structure in the area is about equal to the pre-determined density.

A third aspect of the invention provides a program product stored on a computer-readable medium, which when executed, increases power line noise immunity in an integrated circuit, the program product comprising: program code for providing a circuit design layout; program code for determining a density of a structure in an area of the circuit design layout; and program code for filling in a portion of the area with at least one capacitor structure, in response to the density being less than a pre-determined density for the structure in the area, until a combined density of the structure and the at least one capacitor structure in the area is about equal to the pre-determined density.

A fourth aspect of the invention provides an integrated circuit (IC) comprising: operative structure for providing a function of the IC; and an area void of the operative structure and including a capacitor structure, the capacitor structure including a first metal element connected to a power supply and a second metal element separated from the first metal element by a dielectric and connected to ground.

A fifth aspect of the invention provides a computer-readable medium that includes computer program code to enable a computer infrastructure to increasing power line noise immunity in an integrated circuit, the computer-readable medium comprising computer program code for performing the method steps of the invention.

A sixth aspect of the invention provides a business method for increasing power line noise immunity in an integrated circuit, the business method comprising managing a computer infrastructure that performs each of the steps of the invention; and receiving payment based on the managing step.

A seventh aspect of the invention provides a method of generating a system for increasing power line noise immunity in an integrated circuit, the method comprising: obtaining a computer infrastructure; and deploying means for performing each of the steps of the invention to the computer infrastructure.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIG. 3 shows a cross-sectional view of an illustrative circuit design layout.

FIG. 4 shows a cross-sectional view of the circuit design layout of FIG. 3 including capacitor structures formed according to one embodiment of the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

As indicated above, the invention provides increased power line noise immunity in an integrated circuit (IC) by using decoupling capacitor structure in an area of the IC typically used for fill. In one embodiment, a method includes providing a circuit design layout; determining a density of a structure in an area of the circuit design layout; and in response to the density being less than a pre-determined density for the structure in the area, filling in a portion of the area with at least one capacitor structure until a combined density of the structure and the at least one capacitor structure in the area is about equal to the pre-determined density. Power line noise immunity is increased by increasing decoupling capacitance without enlarging the IC's total size by using a (fill) area that would normally be filled with useless filler shapes.

Figure 1:
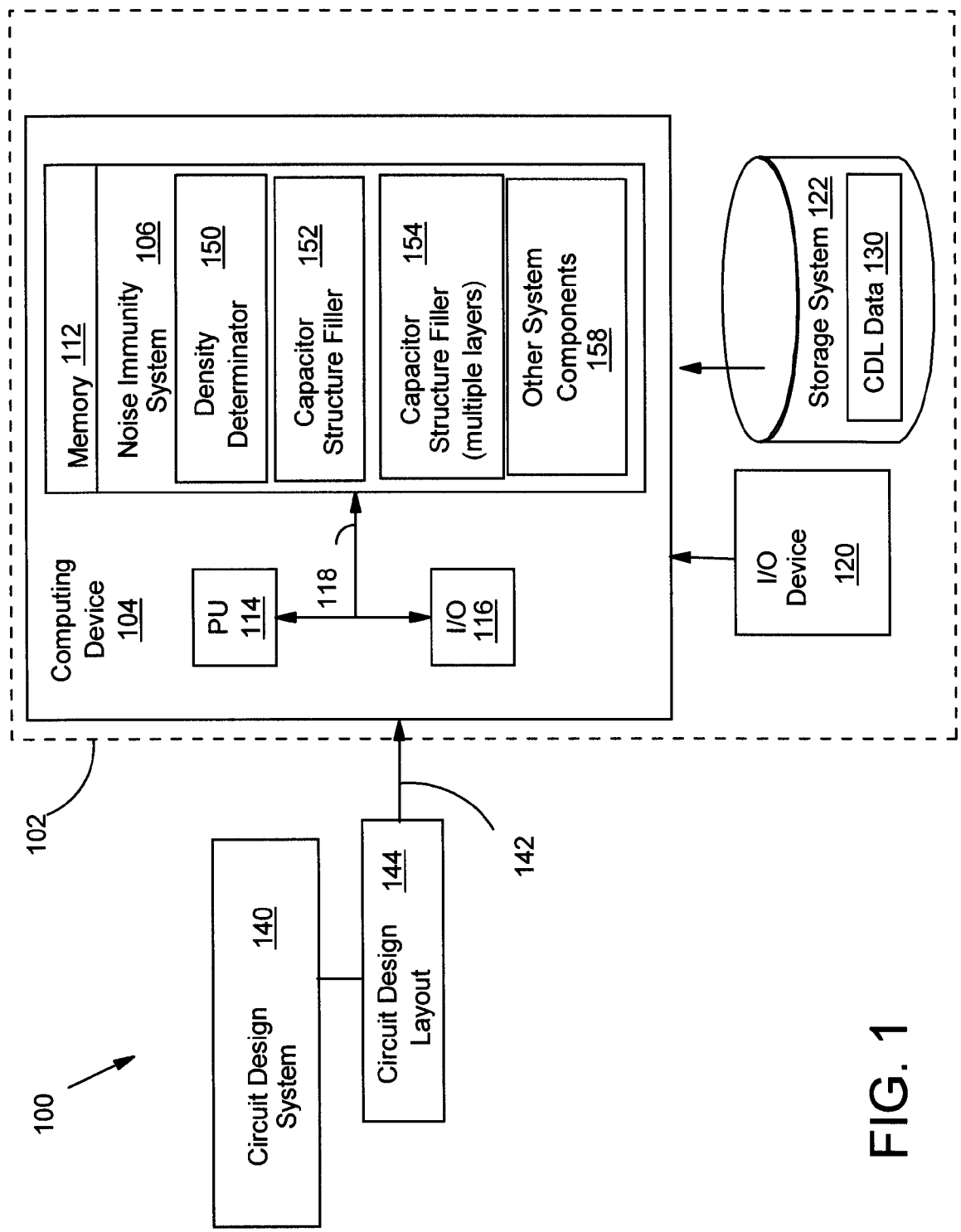
FIG. 1 shows a block diagram of an illustrative environment for increasing power line noise immunity in an integrated circuit.

Turning to the drawings, FIG. 1 shows an illustrative environment 100 for increasing power line noise immunity in an integrated circuit. Environment 100 includes a computer infrastructure 102 that can perform the various process steps described herein for increasing power line noise immunity in an IC. In particular, computer infrastructure 102 is shown including a computing device 104 that comprises a power line noise immunity improvement system 106 (shown as simply "noise immunity system" and hereinafter just "noise immunity system"), which enables computing device 104 to increase power line noise immunity in an IC by performing the process steps of the invention.

Computing device 104 is shown including a memory 112, a processor unit (PU) 114, an input/output (I/O) interface 116, and a bus 118. Further, computing device 104 is shown in communication with an external I/O device/resource 120 and a storage system 122. As is known in the art, in general, PU 114 executes computer program code, such as noise immunity system 106, that is stored in memory 112 and/or storage system 122. While executing computer program code, processor 114 can read and/or write data, such as circuit design layout (CDL) data 130, to/from memory 112, storage system 122, and/or I/O interface 116. Bus 118 provides a communications link between each of the components in computing device 104. I/O device 118 can comprise any device that enables a user to interact with computing device 104 or any device that enables computing device 104 to communicate with one or more other computing devices.

Computing device 104 can comprise any general purpose computing article of manufacture capable of executing computer program code installed by a user (e.g., a personal computer, server, handheld device, etc.). However, it is understood that computing device 104 and noise immunity system 106 are only representative of various possible equivalent computing devices that may perform the various process steps of the invention. To this extent, in other embodiments, computing device 104 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 102 is only illustrative of various types of computer infrastructures for implementing the invention. For example, in one embodiment, computer infrastructure 102 comprises two or more computing devices (e.g., a server cluster) that communicate over any type of wired and/or wireless communications link, such as a network, a shared memory, or the like, to perform the various process steps of the invention. When the communications link comprises a network, the network can comprise any combination of one or more types of networks (e.g., the Internet, a wide area network, a local area network, a virtual private network, etc.). Regardless, communications between the computing devices may utilize any combination of various types of transmission techniques.

Computer infrastructure 102 can further comprise or be connected to a circuit design system 140 (shown separately) for designing and providing to computing device 104 a circuit design layout 144. Circuit design system 140 is shown in communication with computing device 104 over a communications link 142. As discussed above, communications link 142 can comprise any combination of various types of communications links as is known in the art. In one embodiment, circuit design system 140 comprises a computing device that is in communication with computing device 104 over any now known or later developed network. Regardless, it is understood that circuit design system 140 can comprise the same components (processor, memory, I/O interface, etc.) as shown for computing device 104. These components have not been separately shown and discussed for brevity. In an alternative embodiment, circuit design system 140 may be provided as an integral part of noise immunity system 106, or vice versa.

As previously mentioned and discussed further below, noise immunity system 106 enables computing infrastructure 102 to increase power line noise immunity in an IC. To this extent, noise immunity system 106 is shown including the following systems: a density determinator 150, a capacitor structure filler 152, a multiple layer handler 154 and other system components 158. Other system components 158 may include any other function required for operation but not expressly addressed herein. Operation of each of these systems is discussed further below. However, it is understood that some of the various systems shown in FIG. 1 can be implemented independently, combined, and/or stored in memory for one or more separate computing devices that are included in computer infrastructure 102. Further, it is understood that some of the systems and/or functionality may not be implemented, or additional systems and/or functionality may be included as part of environment 100.

Figure 2:
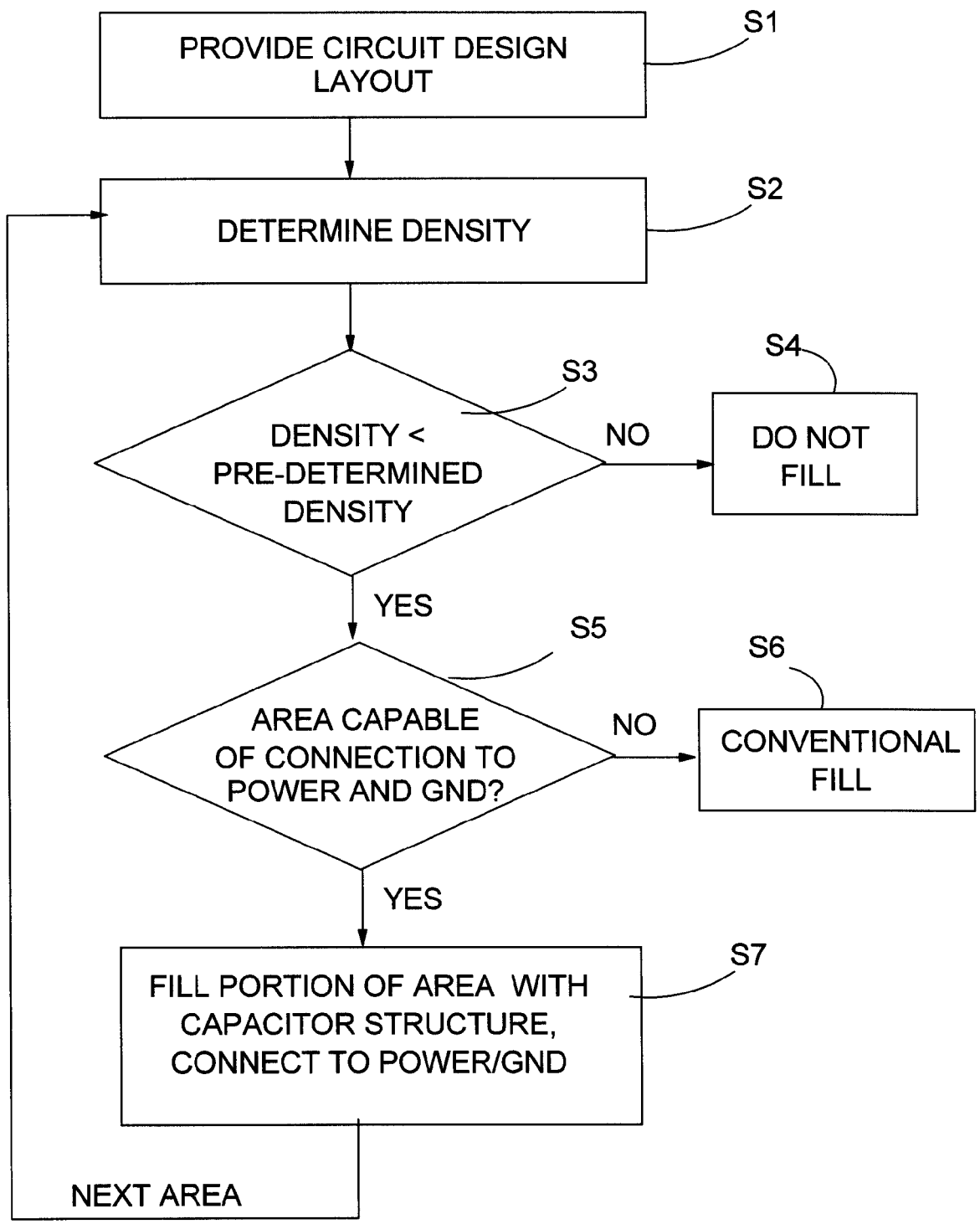
FIG. 2 shows a flow diagram of one embodiment of operation of the noise immunity system of FIG. 1.

Turning to FIG. 2, in conjunction with FIGS. 1 and 3, one embodiment of operation of the above-described noise immunity system 106 will now be described. In a first step S1, a circuit design layout 144 is provided. Circuit design layout 144 may be provided by a separate circuit design system 140 such as Cadence or similar systems, or such systems may be incorporated in noise immunity system 106. FIG. 3 shows a cross-sectional view of an illustrative circuit design layout 144. Circuit design layout 144 may include any type of circuit design that includes an area 160 that requires fill, i.e., metal elements, in a portion 162 thereof to increase a density of structure 164 in area 160. In one embodiment, structure 164 may include a plurality of interconnects. Portion 162 is part of area 160 in which no operative structure of the IC is provided. Portion 162 includes an isolation layer 168 to electrically insulate it from other layers, e.g., layers 166. Circuit design layout 144 may also include any number of FEOL layers 166.

Continuing with FIG. 2, next, in step S2, density determinator 150 determines a density of structure 164 in area 160 of circuit design layout 144. Density determinator 150 may include any now known or later developed structure density checking analyzer. In one embodiment, the density of a particular layer 182 (FIG. 4) may be determined, for example, in 10 μm×10 μm squares, and then a density of structure 164 in area 160 extrapolated from that data. However, the density of structure 164 in area 160 may also be directly determined.

In step S3, density determinator 150 also determines whether the density is less than a pre-determined density for structure 164 in area 160. If the density is not less than the pre-determined density for structure 164 in area 160, i.e., NO at step S3, then processing proceeds to step S4. At step S4, any other now known or later developed circuit design processing may follow. For example, no fill may be provided may be provided where the density is greater than a pre-determined density. Alternatively, in response to the density being less than a pre-determined density for structure 164 in area 160, i.e., YES at step S3, at step S5, capacitor structure filler 152 determines whether connection to a power supply (e.g., Vdd) and ground (i.e., 0V) is possible for area 160. Typically, connections to a power supply and ground are not difficult because buses for each are usually within or easily accessible to each layer. Accordingly, in one alternative embodiment, this step may be omitted. If the step is provided, and it is determined that connection is not possible, i.e., NO at step S5, then at step S6, conventional isolated fill shapes are used using any now known or later developed process.

If connection is possible, i.e., YES at step S5, capacitor structure filler 152 (FIG. 1), as shown in FIG. 4, fills in portion 162 of area 160 with at least one capacitor structure 170, at step S7. Capacitor structure filler 152 also connects each capacitor structure to a power supply (e.g., Vdd) and ground (i.e., 0V). In one embodiment, each capacitor structure 170 includes a first metal element 172 connected to a power supply (e.g., Vdd) and a second metal element 174 separated from first metal element 172 by a dielectric 176 and connected to ground (i.e., 0V). Metal elements 172, 174 and dielectric 176 are only labeled once in FIG. 4 for clarity. First and second elements 172, 174 and dielectric 176 are spaced such that a 'fringe' capacitive effect is created between first and second elements 172, 174, i.e., they are closer together than typical fill. If necessary, at least one metal element 172, 174 may be connected to the power supply or ground by a via 178 to connect to the power buses (not shown in FIG. 4). In one illustrative embodiment, capacitor structures could result in a total decoupling capacitance of approximately 2.6 K pF to approximately 13.7 K pF. Capacitor structure 170 is added until a combined density of structure 164 and the at least one capacitor structure 170 in area 160 is about equal to the pre-determined density. At that point, no further structure is added and area 160 is considered to have sufficient density to withstand any required processing, e.g., chemical mechanical polishing etc. Although not shown in FIG. 2, if fill using capacitor structure 170 cannot be implemented such that the density is about equal to the pre-determined density, then conventional fill may then be used to finish area 160.

Figure 5:
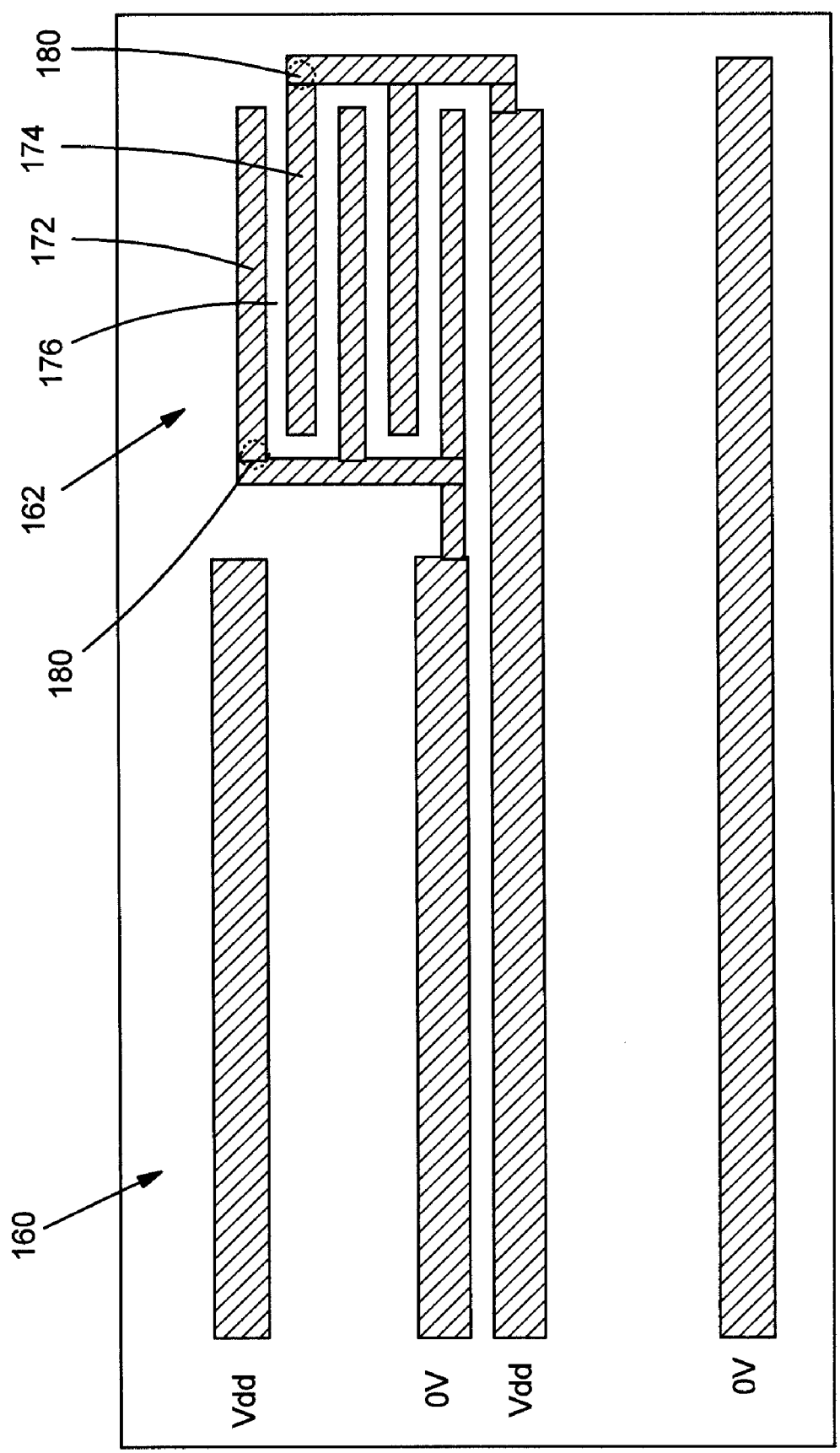
FIGS. 5-8 show plan views of alternative embodiments of capacitor structures formed according to one embodiment of the invention.
Figure 6:
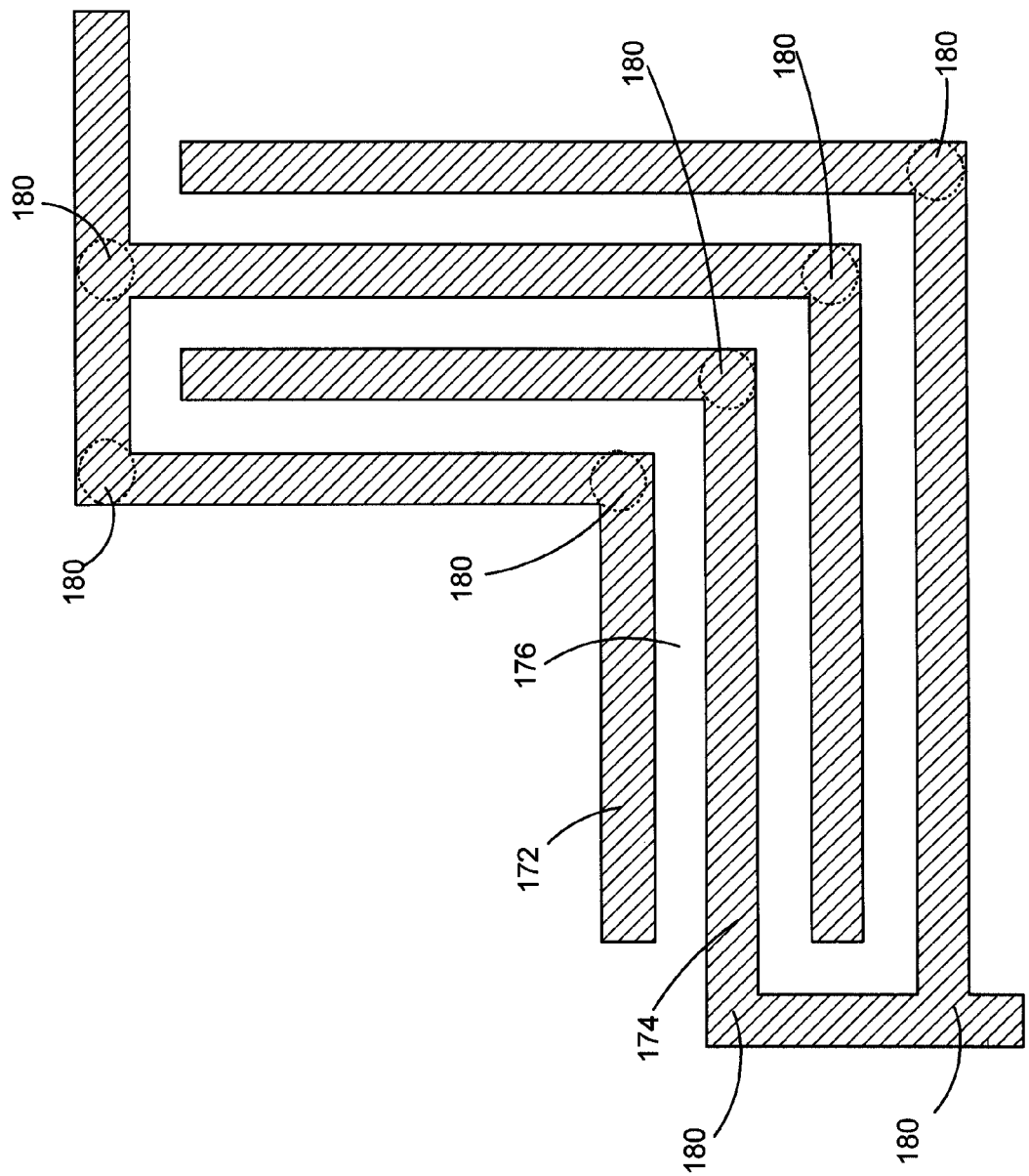
Figure 8:
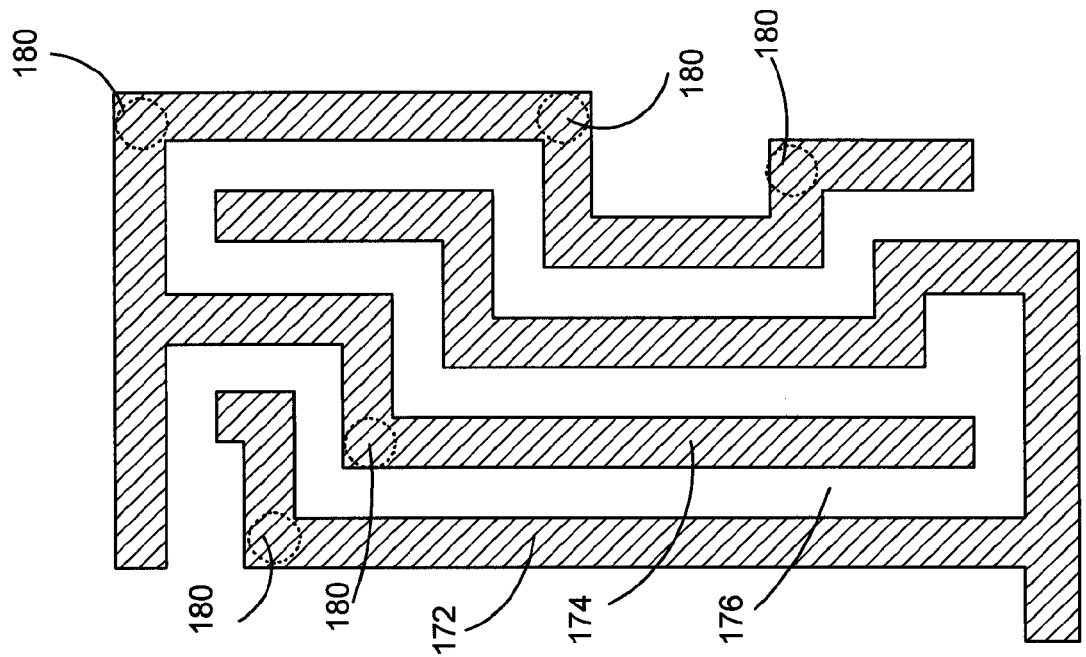
Figure 7:
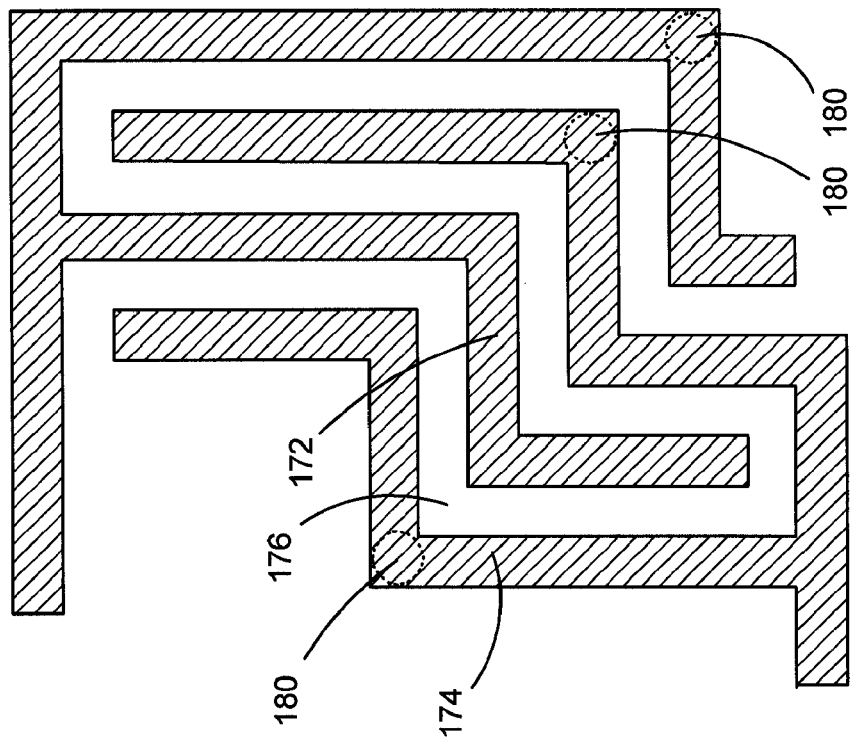

Turning to FIG. 5, a plan view of one alternative embodiment is shown. In this embodiment, each metal element (multi-fingers) 172, 174 may also include their connection via 180 (shown in phantom) on both sides of the capacitor, which increases the capacitance compared to single straight line capacitor structures. Because each via 180 extends into or out of the page, each metal element 172, 174 may include at least one turn of about 90°. Referring to FIGS. 6-8, plan views of other alternative embodiments are shown, which include illustrative capacitor structure layouts including various multi fingers.

Next, steps S2-S7 may repeat for other areas 160 of circuit design layout 144 (FIG. 1).

Figure 9:
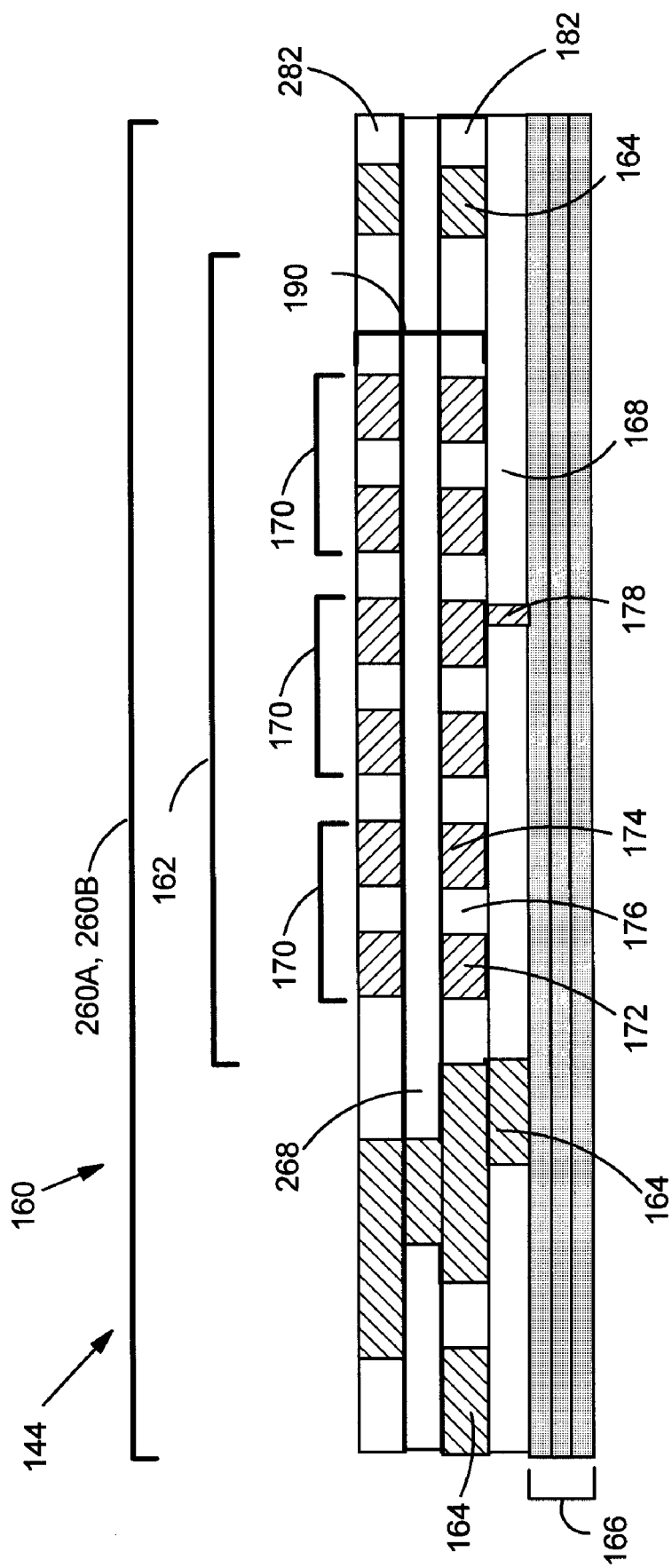
FIGS. 9-10 show cross-sectional views of alternative embodiments of capacitor structures formed within and between layers according to a second embodiment of the invention.
Figure 10:
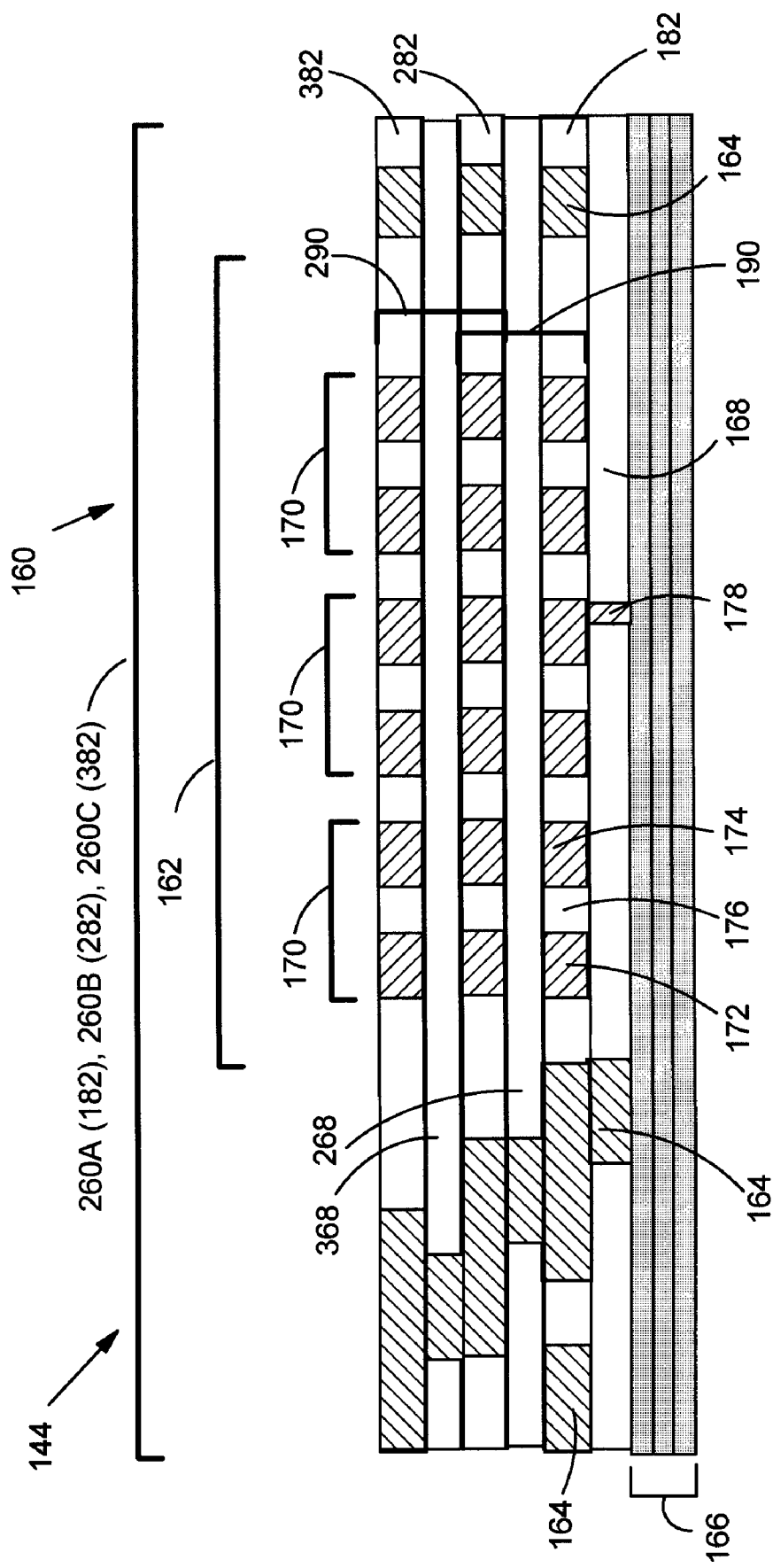
Figure 11:
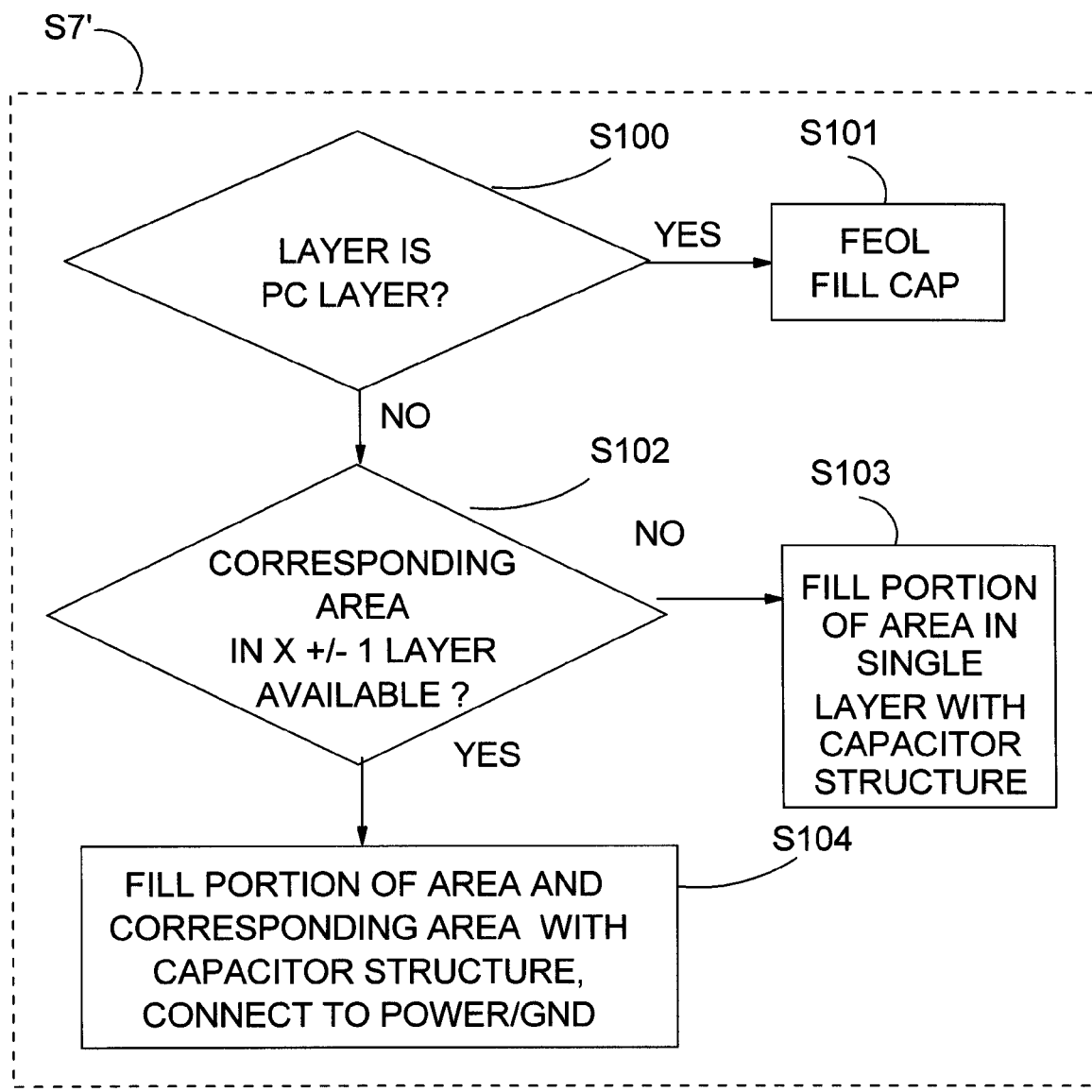
FIG. 11 shows a flow diagram of a second embodiment of operation of the noise immunity system of FIG. 1.

Returning to FIG. 4, in the embodiment shown, each capacitor structure 170 is formed within a single layer 182. However, according to an alternative embodiment, capacitor structures may be formed within a single layer and/or between adjacent layers. Turning to FIGS. 9-11, an alternative filling procedure for single and/or multiple layers will now be described. In this case, as shown in FIGS. 9-10, area 160 includes a first area 260A of a first layer 182 and a corresponding second area 260B, 260C of at least one second layer 282, 382 of circuit design layout 144. FIG. 9 shows one second layer 282 and corresponding second area 260B, and FIG. 10 shows two second layers 282, 382 and corresponding second areas 260B, 260C, respectively. Each layer is adjacent to another layer 182, 282, 382 except for isolation layers 168, 268, 368. In this case, step S7 of FIG. 4 may be implemented as shown in the flow diagram of FIG. 11.

Turning to FIG. 11, in step S100, multiple layer handler 154 may determine whether a layer 166, 182, 282, 382 in which an area under consideration resides in a polysilicon conductor (PC) layer. This determination indicates whether the layer is a front-end-of-line (FEOL) layer 166 or a back-end-of-line (BEOL) layer 182, 282, 382. If the layer is known not to be a PC layer, e.g., only BEOL layers are reviewed, then step S100 may be omitted, and processing would begin with step S102, described below. If the layer in which the area under consideration resides is a PC layer, i.e., YES at step S100, processing proceeds to step S101 at which filling FEOL capacitors are implemented. That is, the FEOL capacitors such as ncap, pcap, moscap and so on. If the layer in which the area under consideration resides is not a PC layer, i.e., NO at step S100, this indicates that the layer is a metal layer, and processing proceeds to step S102. At step S102, multiple layer handler 154 determines whether a corresponding second area 260A, 260B, 260C of the at least one second layer, i.e., a layer above or below (i.e., layer X+/−1) an area 260A, 260B, 260C under consideration, is available to be filled. For example, if a first area 260B of layer 282 is under consideration for capacitor structure filling by capacitor structure filler 152, then multiple layer handler 154 determines whether a density of a corresponding second area, e.g., 260A and/or 260C, of at least one second layer 182, 282 also has a density less than a pre-determined density. If the density of corresponding second area 260A and/or 260C is not less than a pre-determined density, i.e., corresponding area 260A and/or 260C is unavailable—NO at step S102, then at step S103, capacitor structure filler 152 fills a portion of first area 260B only with capacitor structure 170. That is, only a single layer 282 is filled with capacitor structures 170. Alternatively, if the density of corresponding second area 260A and/or 260C is less than a pre-determined density, i.e., corresponding second area 260A and/or 260C is available—YES at step S102, then at step S104, capacitor structure filler 152 fills a portion of first area 260B and a portion of an available corresponding area (i.e., 260A and/or 260C) until a combined density of structure 164 and the at least one capacitor structure 170 in each area is about equal to the pre-determined density for each respective area. This step forms at least one capacitor structure 170 within each layer having an available area and at least one capacitor structure between the first layer and the at least one second layer. As a result, capacitor structures 170 provide a 'fringe' capacitive effect within each layer, and a 'face-to-face' capacitive effect is provided between any layers 182, 282, 382 having a fillable (available) area, 260A-260C by capacitor structures 190. Capacitor structure filler 152 also connects each capacitor structure 170, 190 to a power supply (e.g., Vdd) and ground (i.e., 0V), at step S104.

It should be recognized that any capacitor structure 170, 190 provided according to the invention are not to violate any design rule for the IC.

While shown and described herein as a method and system for increased power line noise immunity in an IC, it is understood that the invention further provides various alternative embodiments. For example, in one embodiment, the invention provides a computer-readable medium that includes computer program code to enable a computer infrastructure to increased power line noise immunity in an IC. To this extent, the computer-readable medium includes program code, such as noise immunity system 106 (FIG. 1), that implements each of the various process steps of the invention. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 112 (FIG. 1) and/or storage system 122 (FIG. 1) (e.g., a fixed disk, a read-only memory, a random access memory, and/or a cache memory, etc.).

In another embodiment, the invention provides a business method that performs the process steps of the invention on a subscription, advertising, and/or fee basis. That is, a service provider, such as an Internet Service Provider, could offer to increase power line noise immunity in an IC as described above. In this case, the service provider can manage (e.g., create, maintain, support, etc.) a computer infrastructure, such as computer infrastructure 102 (FIG. 1), that performs the process steps of the invention for one or more customers. In return, the service provider can receive payment from the customer(s) under a subscription and/or fee agreement and/or the service provider can receive payment from the sale of advertising space to one or more third parties.

In still another embodiment, the invention provides a method of generating a system for increasing power line noise immunity in an IC. In this case, a computer infrastructure, such as computer infrastructure 102 (FIG. 1), can be obtained (e.g., created, maintained, having made available to, etc.) and one or more systems for performing the process steps of the invention can be obtained (e.g., created, purchased, used, modified, etc.) and deployed to the computer infrastructure. To this extent, the deployment of each system can comprise one or more of (1) installing program code on a computing device, such as computing device 104 (FIG. 1), from a computer-readable medium; (2) adding one or more computing devices to the computer infrastructure; and (3) incorporating and/or modifying one or more existing systems of the computer infrastructure, to enable the computer infrastructure to perform the process steps of the invention.

As used herein, it is understood that the terms "program code" and "computer program code" are synonymous and mean any expression, in any language, code or notation, of a set of instructions intended to cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of increasing power line noise immunity in an integrated circuit, the method comprising at least one computing device processing the steps of:
    a computing device providing a circuit design layout;
    a computing device determining a density of a structure in an area of the circuit design layout; and
    in response to the density being less than a pre-determined density for the structure in the area, filling in a portion of the area with at least one capacitor structure until a combined density of the structure and the at least one capacitor structure in the area is about equal to the pre-determined density;
    wherein one of the at least one capacitor structure is formed within a single layer.

2. The method of claim 1, wherein the structure includes a plurality of interconnects.

3. The method of claim 1, wherein each capacitor structure includes a first metal element connected to a power supply and a second metal element separated from the first metal element by a dielectric and connected to ground.

4. The method of claim 3, wherein at least one metal element is connected to one of the power supply and ground by a via.

5. The method of claim 3, wherein each metal element includes at least one turn of about 90°.

6. The method of claim 1, wherein the area includes a first area of a first layer and a corresponding second area of at least one second layer of the circuit design layout, and wherein the filling step further includes:
    determining whether the corresponding second area of the at least one second layer is available for filling; and
    filling in a portion of the first area and a portion of an available corresponding second area, until a combined density of the structure and the at least one capacitor structure in each area is about equal to the pre-determined density for each respective area, to form at least one capacitor structure within each layer having an available area and at least one capacitor structure between the first layer and the at least one second layer.

7. A system for increasing power line noise immunity in an integrated circuit, the system comprising:
means for providing a circuit design layout;
means for determining a density of a structure in an area of the circuit design layout; and
means for filling in a portion of the area with at least one capacitor structure, in response to the density being less than a pre-determined density for the structure in the area, until a combined density of the structure and the at least one capacitor structure in the area is about equal to the pre-determined density;
wherein one of the at least one capacitor structure is formed within a single layer.

8. The system of claim 7, wherein the structure includes a plurality of interconnects.

9. The system of claim 7, wherein each capacitor structure includes a first metal element connected to a power supply and a second metal element separated from the first metal element by a dielectric and connected to ground.

10. The system of claim 9, wherein at least one metal element is connected to one of the power supply and ground by a via.

11. The system of claim 9, wherein each metal element includes at least one turn of about 90°.

12. The system of claim 7, wherein the area includes a first area of a first layer and a corresponding second area of at least one second layer of the circuit design layout, and wherein the system further comprises:
means for determining whether the corresponding second area of the at least one second layer is available for filling; and
wherein filling means further fills in a portion of the first area and a portion of an available corresponding second area, until a combined density of the structure and the at least one capacitor structure in each area is about equal to the pre-determined density for each respective area, to form at least one capacitor structure within each layer having an available area and at least one capacitor structure between the first layer and the at least one second layer.

13. A program product stored on a computer-readable medium, which when executed, increases power line noise immunity in an integrated circuit, the program product comprising:
program code for providing a circuit design layout;
program code for determining a density of a structure in an area of the circuit design layout; and
program code for filling in a portion of the area with at least one capacitor structure, in response to the density being less than a pre-determined density for the structure in the area, until a combined density of the structure and the at least one capacitor structure in the area is about equal to the pre-determined density;
wherein one of the at least one capacitor structure is formed within a single layer.

14. The program product of claim 13, wherein the area includes a first area of a first layer and a corresponding second area of at least one second layer of the circuit design layout, and wherein the program product further comprises:
program code for determining whether the corresponding second area of the at least one second layer is available for filling; and
wherein filling code further fills in a portion of the first area and a portion of an available corresponding second area, until a combined density of the structure and the at least one capacitor structure in each area is about equal to the pre-determined density for each respective area, to form at least one capacitor structure within each layer having an available area and at least one capacitor structure between the first layer and the at least one second layer.

15. An integrated circuit (IC) comprising:
operative structure for providing a function of the IC; and
an area void of the operative structure and including a capacitor structure, the capacitor structure including a first metal element connected to a power supply and a second metal element separated from the first metal element by a dielectric and connected to ground, wherein a combined density of the operative structure and the void area including the capacitor structure is about equal to a pre-determined density for a combined area of the operative structure and the void area, and wherein the capacitor structure is formed within a single layer.

16. The IC of claim 15, wherein the structure includes a plurality of interconnects.

17. The IC of claim 15, wherein the area includes at least a first area in a first layer and a second area in an adjacent, second layer, and further comprising a capacitor structure including a metal element within the first layer and another metal element within the adjacent, second layer, separated from the metal element by a dielectric of the adjacent, second layer.

* * * * *